(12) United States Patent
Ohara et al.

(10) Patent No.: US 6,277,756 B1
(45) Date of Patent: Aug. 21, 2001

(54) METHOD FOR MANUFACTURING SEMICONDUCTOR DEVICE

(75) Inventors: Junji Ohara, Toyota; Shinji Yoshihara, Nagoya; Kazuhiko Kano, Toyoake; Nobuyuki Ohya, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/501,762

(22) Filed: Feb. 10, 2000

(30) Foreign Application Priority Data

Feb. 12, 1999 (JP) .................................................. 11-034671
Dec. 13, 1999 (JP) .................................................. 11-353393

(51) Int. Cl.[7] ........................ H01L 21/311; H01L 21/00; H01L 21/8242; H01L 21/76
(52) U.S. Cl. ........................... 438/700; 438/44; 438/243; 438/444
(58) Field of Search ........................... 438/301, 44, 386, 438/243, 421, 444, 700

(56) References Cited

U.S. PATENT DOCUMENTS

| | | | |
|---|---|---|---|
| 4,704,368 | * 11/1987 | Goth et al. | 437/60 |
| 4,981,811 | * 1/1991 | Feygenson et al. | 437/46 |
| 5,112,771 | * 5/1992 | Ishii et al. | 437/67 |
| 5,191,509 | * 3/1993 | Wen | 361/311 |
| 5,470,768 | * 11/1995 | Yanai et al. | 437/40 |
| 5,501,893 | * 3/1996 | Laermer et al. | . |
| 5,522,966 | 6/1996 | Komura et al. | . |
| 5,643,826 | * 7/1997 | Ohtani et al. | 437/88 |
| 5,658,472 | 8/1997 | Bartha et al. | . |
| 5,770,465 | * 6/1998 | MacDonald et al. | 437/67 |
| 5,998,835 | * 12/1999 | Furukawa et al. | 257/330 |
| 6,100,132 | * 8/2000 | Sato et al. | 438/243 |
| 6,110,826 | * 8/2000 | Lou et al. | 438/674 |

FOREIGN PATENT DOCUMENTS

| | | |
|---|---|---|
| 62-102529 | 5/1987 | (JP) . |
| 63-289936 | 11/1988 | (JP) . |
| 2-290022 | 11/1990 | (JP) . |

OTHER PUBLICATIONS

E.M. Young, et al. "UV light stimulated thermal oxidation of silicon", APL 50 (2), pp. 80–82. Date unknown.*
M. Niwano et al. "UV ozone oxidation of Si surface studied by photoemission and surface IR spectroscopy", J. Vac. Sci. TEch. A, 10 (5), pp. 3171–3175. Date unknown.*

* cited by examiner

*Primary Examiner*—John F. Niebling
*Assistant Examiner*—Viktor Simkovic
(74) *Attorney, Agent, or Firm*—Law Office of David G. Posz

(57) ABSTRACT

A method of manufacturing a semiconductor device, which can effectively form a trench having a high aspect ratio with relatively simple steps. An initial trench is formed in a silicon substrate by a reactive ion etching using an oxide film mask as an etching mask. After forming a protection oxide film on an inside surface of the trench, a part of the protection oxide film at which positions at a bottom surface of the trench is removed by a reactive ion etching, so that an etching of the silicon substrate is advanced through the bottom surface of the trench. Furthermore, the step for forming the protection oxide film and the step for re-etching the bottom surface of the trench are repeatedly performed, so that a depth of the trench becomes a predetermined depth. These steps are performed in a common chamber by using plasma processed with switching gases to be introduced to the chamber.

10 Claims, 7 Drawing Sheets

METHOD FOR MANUFACTURING SEMICONDUCTOR DEVICE

CROSS REFERENCE TO RELATED APPLICATION

This application is based upon Japanese Patent Application No. Hei. 11-34671 filed on Feb. 12, 1999, and Hei. 11-353393 filed on Dec. 13, 1999, the contents of which are incorporated herein by reference.

BACKGROUND OF THE INVENTION

1. Field of the Invention

This invention relates to methods of manufacturing a semiconductor device. More specifically, the invention relates to a method of manufacturing a semiconductor device having a trench.

2. Related Art

A semiconductor acceleration or angular velocity sensor typically includes a small comb-shaped beam structure formed on a substrate for detecting a physical quantity. The comb-shaped structure is formed so that the physical quantity is detected by way of electrostatic force. The distance between each comb-like element must be narrow, and the thickness of the structure must be set to a particular value in order to downsize the sensor and achieve a high detection performance.

The typical comb-shaped structure is created by forming a mask on the substrate and by dry-etching the substrate through the mask. The aspect ratio of the trench, which is the depth of a trench with respect to an opening width of the trench, is typically set to a large number.

A large trench aspect ratio can be a limitation from a process technology viewpoint. In the case of normal dry etching, if high anisotropy anisotropic etching (in which an etching rate for a vertical direction of the substrate is higher than that for the other directions) is used, the etching is typically gradually advanced in a width direction of the trench from a surface portion of the substrate in the trench. Therefore, when the etching is performed for a long time, a sectional shape of the trench may be a V-shape because the trench width is gradually enlarged, so that the aspect ratio is saturated at a certain degree.

A method of solving the above problem is disclosed in U.S. Pat. No. 5,501,893 to Laermer. Laermer discloses a dry-etching method including two steps including (1) plasma etching having a high anisotropy; and (2) deposition of a polymer-based thin film.

During thin film deposition, the polymer-based thin film is deposited on each sidewall of the etched trenches in order to serve as a protection film and to prevent the sidewall of the trench from being etched during plasma etching. In this manner, it can prevent the opening of the trench from being etched toward the opening width direction and improve an upper limitation of the aspect ratio of the trench shape compared to normal dry etching.

However, this method fails to completely protect the sidewalls from being etched because the trench width is slightly enlarged. The limitation of the aspect ratio is also present. FIG. 9 shows the relationship between process time and aspect ratio when the trench is experimentally processed in a reactive dry etching (RIE) apparatus based on the above-described method. As shown from this figure, the aspect ratio never exceeds 25 even when the etching is performed for a long time.

Another method to solve the above-described inconvenience is disclosed in U.S. Pat. No. 5,658,472 to Bartha. Bartha also divides an etching process into an etching step and a step for forming a protection film on a sidewall of a trench, and alternately performs these two steps. In this technology, the step for forming the protection film is performed by depositing a thermal oxide film ($SiO_2$) in a chamber different from that in which the etching is performed, or by depositing a thin ice film in the chamber in which the etching is performed. In comparison to the polymer-based film, the aspect ratio is improved because the films disclosed in Bartha have durability for sidewall etching.

However, it would take a long time to unload the substrate and to form the thermal oxide film every time the protection film is deposited. Furthermore, the temperature of the substrate needs to rise and fall after every unloading. Therefore, it is not preferable from a viewpoint of process throughput. Also, the substrate needs to be below the freezing point during the etching in order to use the ice film as the protection film. These limitations cause the apparatus to be complicated.

SUMMARY OF THE INVENTION

This invention has been conceived in view of the background thus far described and its first object is to effectively form a trench having a high aspect ratio with relatively simple steps.

Its second object is to provide a method of manufacturing a semiconductor device having a trench whose aspect ratio can be easily increased.

According to the present invention, a method of manufacturing a semiconductor device includes: loading a semiconductor substrate having a mask thereon to a chamber; forming a trench in the semiconductor substrate by using a reactive ion etching using the mask; forming a protection film on an inside surface of the trench, and; etching a part of the protection film positioned at a bottom portion of the trench, and for etching the semiconductor substrate through the bottom portion of the trench by using a reactive ion etching to deepen the trench. The protection film forming and bottom surface etching are performed under a plasma of gas introduced into the chamber. The type of gas is changed based upon the particular step. The protection film forming and the bottom surface etching are done repeatedly in order to form the final trench.

According to the above-described method, after an initial trench is formed, a protection film is formed on the inside surface of the initial trench. The reactive ion etching is then performed. In this method, the protection film on the bottom surface of the trench is removed prior to the sidewall of the trench because of the etching anisotropy. The etching is then advanced to a depth direction of the trench. Repeatedly performing the above prevents the opening width of the trench from being enlarged and achieves a high aspect ratio.

The present method is an improvement over the prior art methods. In the present method it is unnecessary to remove the semiconductor substrate from the chamber to form the protection film, or to repeatedly rise or lower the temperature of the semiconductor substrate.

According to another aspect of the present invention, a method of manufacturing a semiconductor device includes: forming a trench in the semiconductor substrate by using a reactive ion etching, and forming a polymer film as a first protection film on an inside surface of the trench; and forming a second protection film that has a high durability for etching compared to the polymer film on the inside surface of the trench after the trench and first protection film are formed. This method is repeatedly performed to form a final trench.

The above-described method can increase durability for a laterally advancing etching by covering the sidewall of the trench with the first and second protection film. The method controls etching in the depth direction by forming a polymer film on the bottom surface of the trench and subsequently removing the film. As a result, it can prevent both the width of the trench from being enlarged and the etching from stopping due to the trench becoming tapered.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions have the same numerals in order to eliminate redundant explanation. In the drawings:

DESCRIPTION OF THE PREFERRED EMBODIMENTS (First Embodiment)

FIG. 1 shows a trench-forming step according to a first embodiment in which the present invention is applied to form a trench of a semiconductor device. Hereinafter, the trench formation of this embodiment will be explained with reference to FIGS. 1A–1E.

Figure 1A:
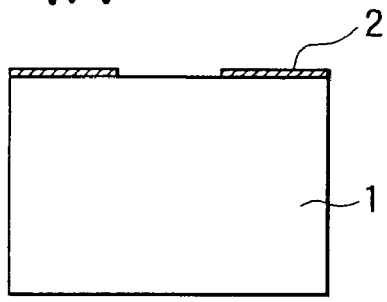
FIGS. 1A–1E are sectional views illustrating trench formation according to a first embodiment of the present invention.

In FIG. 1A, an oxide film ($SiO_2$) is formed on a silicon (Si) substrate 1. A predetermined region of the oxide film where a trench is to be formed is partly opened to form an oxide film mask 2. As a result, a region where the Si substrate 1 is to be etched is exposed.

Figure 2:
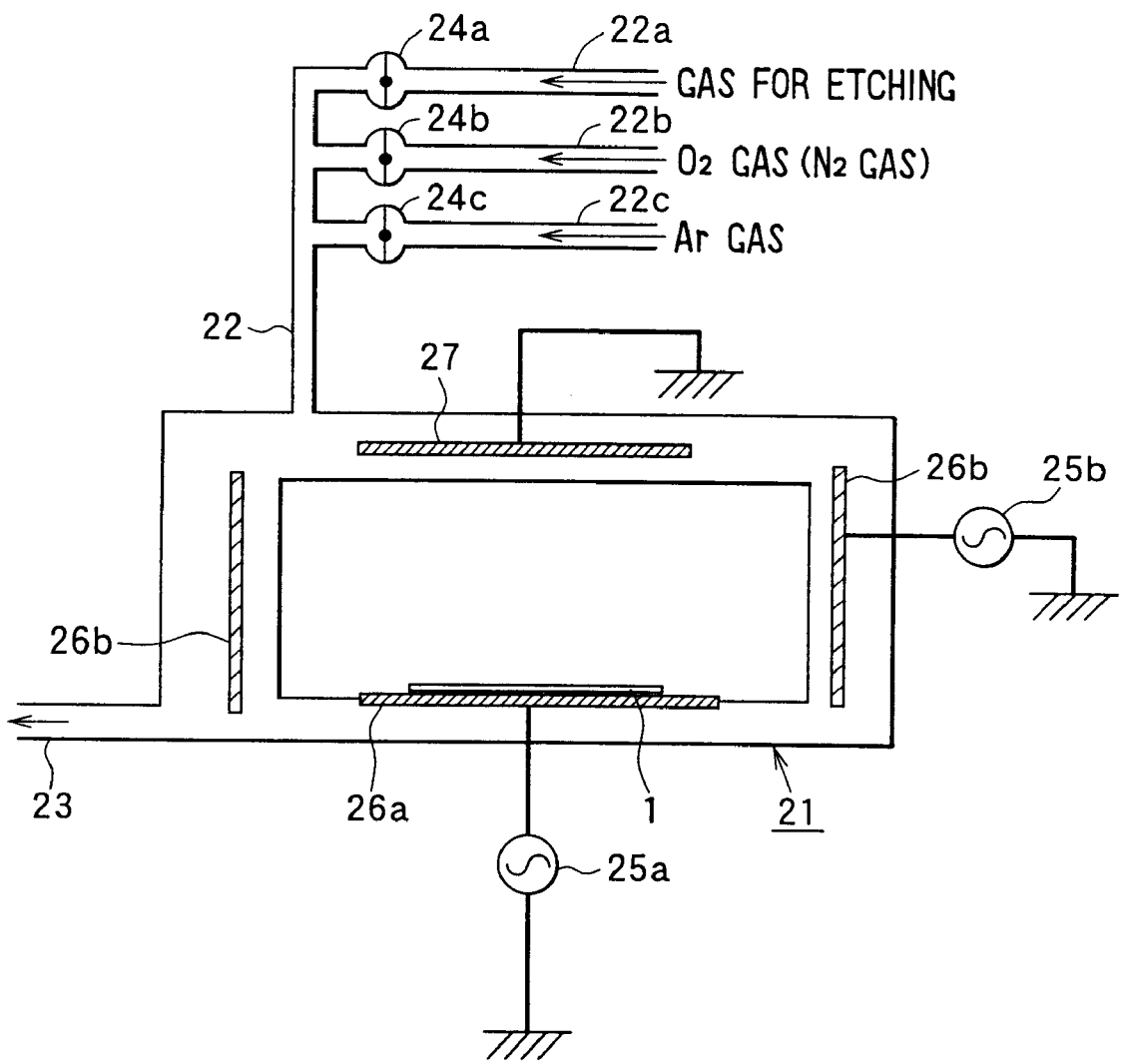
FIG. 2 is a schematic diagram illustrating a chamber in which the trench formation of the first embodiment is to be performed.
Figure 3:
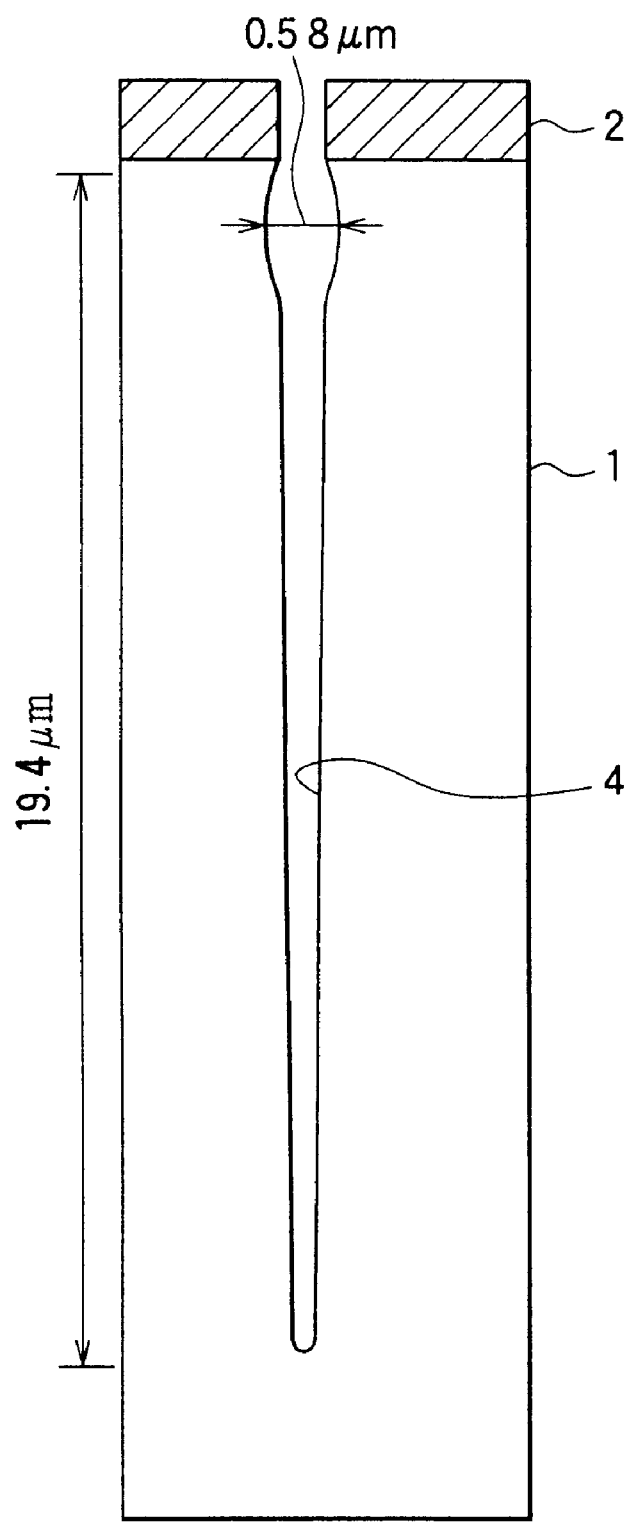
FIG. 3 is a sectional view of a semiconductor device after the trench is formed in the first embodiment.

The Si substrate 1 is then loaded into a chamber. FIG. 2 is a schematic diagram of the chamber. A chamber 21 constituting a vacuum chamber is provided with a gas introduction inlet 22 and a gas exhaust outlet 23. The gas introduction inlet 22 is connected to gas lines 22a, 22b and 22c to introduce a plurality of different gases. The number of gas lines corresponds to the number of different gases to be introduced. Each of the gas lines 22a, 22b and 22c has a change-over valve 24a, 24b and 24c for controlling the introduction of each of the gases to the chamber 21. In the present embodiment, three gas lines 22a, 22b and 22c, each of which introduces oxygen ($O_2$) gas, argon (Ar) gas and etching gas, are connected to the gas introduction inlet 22.

Two electrodes 26a, 26b are connected to two RF (Radio Frequency) power supplies 25a, 25b, and a ground electrode 27 confronted with the electrode 26a are provided in the chamber 21. In this manner the RF electric field is applied to the Si substrate 1.

The Si substrate 1 is mounted on the electrode 26a in the chamber 21 constructed according to the present embodiment. Next, the amount of vacuum in the chamber is sufficiently increased through the gas exhaust outlet 23 by using a vacuum pump. Next, each of the gasses are introduced to the chamber through the gas introduction inlet 22 and exhausted through the gas exhaust outlet 23, so that the pressure of introduced gases is kept constant in the chamber 21. Next, the RF electric field is applied from the RF power supplies 25a, 25b, so that plasma of the introduced gas is generated. Here, the type of gas introduced to the chamber 21 is switched by the change-over valves 24a, 24b and 24c at every step (FIGS. 1B–1E).

Figure 1B:
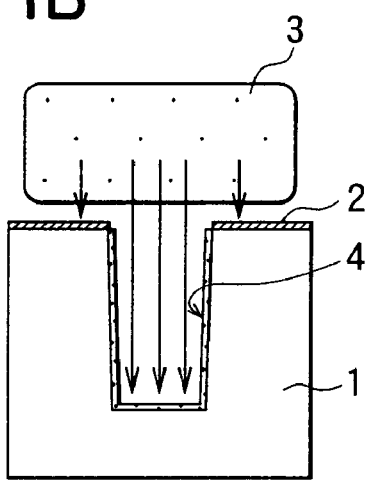

Next, in FIG. 1B, the etching gas is introduced by opening the gas line 22a and closing the other two gas lines 22b, 22c. In this atmosphere, a first trench etching is performed to the substrate by using the oxide film mask 2 as a mask. This dry-etching is adjusted so that the Si substrate 1 is etched to a predetermined depth. By this method an initial trench 4 is formed in the Si substrate 1. This dry etching is performed by a reactive ion etching (RIE). During RIE $SF_6$, $Cl_2$ or the like is introduced as the etching gas and plasma 3 is generated in the $SF_6$ by applying adequate RF electric field to the $SF_6$ in the chamber 21 so that the angle of a sidewall of the trench is within 90±1 degrees based on a relationship between an etching time and a depth. When the angle of the trench is adjusted to within 90± 1 degrees, it can prevent the width of the trench 4 form decreasing or increasing.

Figure 1C:
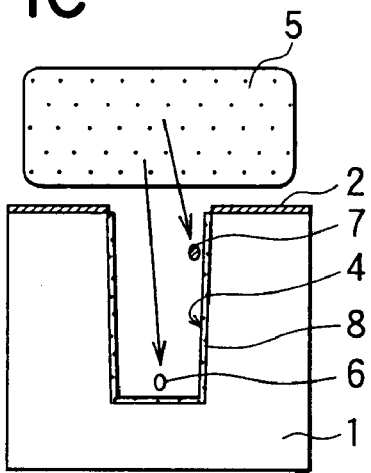

In FIG. 1C, the gas line 22a for introducing the etching gas is closed and the gas lines 22b and 22c for introducing the Ar gas and the $O_2$ gas are opened by using the change-over valves 24a, 24b and 24c so that the gas to be introduced to the chamber 21 is switched from the etching gas to a mixture of the Ar gas and the $O_2$ gas, while the Si substrate 1 remains in the chamber 21. Plasma 5 is then generated in the mixture of Ar gas and the $O_2$ gas in the chamber 21 again by applying the RF electric field to the mixture. Reaction product 8 attached to the sidewall of the trench during the etching step shown in FIG. 1B is removed by oxygen ion or a sputter effect caused by oxygen radical 6 and Ar ion 7 by processing the Si substrate 1 in the plasma atmosphere. Here, the reaction product includes all depositions attached to the sidewall as a result of reciprocal action between the sidewall of the trench 4 and the plasma during the etching. A Si portion of an inside surface of the trench can be exposed by removing the reaction product 8.

Figure 1D:
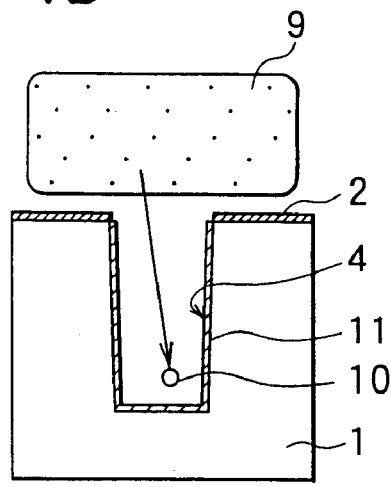

Next, in FIG. 1D, only the gas line 22b for introducing $O_2$ gas is opened by controlling the change-over valves 24a, 24b and 24c so that only the $O_2$ gas is introduced into the chamber 21. Next, $O_2$ plasma is generated by applying the RF electric field in the chamber 21. A protection oxide film ($SiO_2$) 11 is formed on the sidewall of the trench 4 by an action of the oxygen ion 10 (or oxygen radical) by processing the Si substrate 1 in the plasma atmosphere.

Figure 1E:
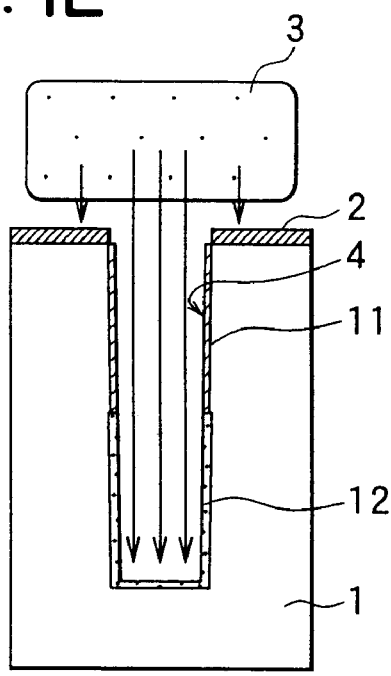

As shown in FIG. 1E, only the gas line 22a for introducing the etching gas is opened by using the change-over valves 24a, 24b and 24c, so that the gas to be introduced to the chamber 21 is switched to the etching gas again. Next, the RF electric filed is applied in the chamber 21. A part of the protection oxide film 11 formed on a bottom surface of the initial trench 4 is removed by an anisotropic etching so that the Si substrate 1 is exposed at the bottom surface of the trench 1. As a result, a second etching using the RIE is performed to the Si substrate 1 through the bottom surface of the trench 4.

The extent of reactive ion etching can be varied by manipulating either the etching depth or the etching time so that the protection oxide film 11 can still cover the entire sidewall of the trench 4 after the reactive ion etching. Here, a reaction product 12 is formed on the inside surface of the trench 4, which becomes further deeper.

Afterwards, the processes shown in FIGS. 1C–1E, in which an oxide film 11 is formed on the inside surface of the trench 4 and an etching is advanced through the bottom surface of the trench 4, are repeatedly performed until the trench 4 has the desired depth.

The experimental result of the above-described method of this embodiment can be explained by making a comparison with the experimental result of the method described in the U.S. Pat. No. 5,501,893 (hereinafter, called "conventional method").

First, a 6-inch Si substrate patterned with an oxide film mask is etched by using an RIE apparatus as in the conventional method. When a standard etching is performed for 18 minutes 45 seconds the mask opening width is 0.5 $\mu$m, the trench depth is 12.3 $\mu$m, the trench opening width is 0.74 $\mu$m and the aspect ratio is 16.6. Even if the etching is advanced further by prolonging the etching time the trench width is gradually increased. For example, when the etching is performed for 70 minutes, the trench depth is 22.1 $\mu$m, the trench width is 0.91 $\mu$m and the aspect ratio is 24.3. Calculations show that the aspect ratio begins to saturate and that the saturation level of the aspect ratio approaches 25 even if the etching time is further prolonged.

In comparison, the processes shown in FIGS. 1A–1E of the present embodiment are performed to the Si substrate 1 under the same etching condition and in the same RIE apparatus as the conventional method. Afterwards, the processes shown in FIGS. 1A–1E are performed again to form the trench 4. The plasma etching as shown in FIGS. 1B and 1E is performed for 10 minutes, so that the total etching time is 30 minutes. The trench 4 is formed by forming the protection oxide film 11 on the inside surface of the trench two times.

As a result, at a portion where a mask opening width is 0.5 $\mu$m, the trench depth becomes 19.4 $\mu$m, the trench opening width becomes 0.58 $\mu$m and the aspect ratio becomes 33.4. Hence, the method of this embodiment can achieve a trench having a higher aspect ratio than that of the conventional method and in a simpler manner. This is done by preventing the trench opening width from increasing (etching towards the width direction) during the etching by forming the protection oxide film on the inside surface of the trench 4.

As a result of the above trench forming method, the Si substrate 1 becomes comb-shaped when it is divided with a predetermined pattern. The method can therefore be used to manufacture a semiconductor device such as a semiconductor acceleration sensor, a semiconductor angular velocity sensor or the like having a physical quantity detection portion made up of a comb-shaped structure.

(Second Embodiment)

Figure 4:
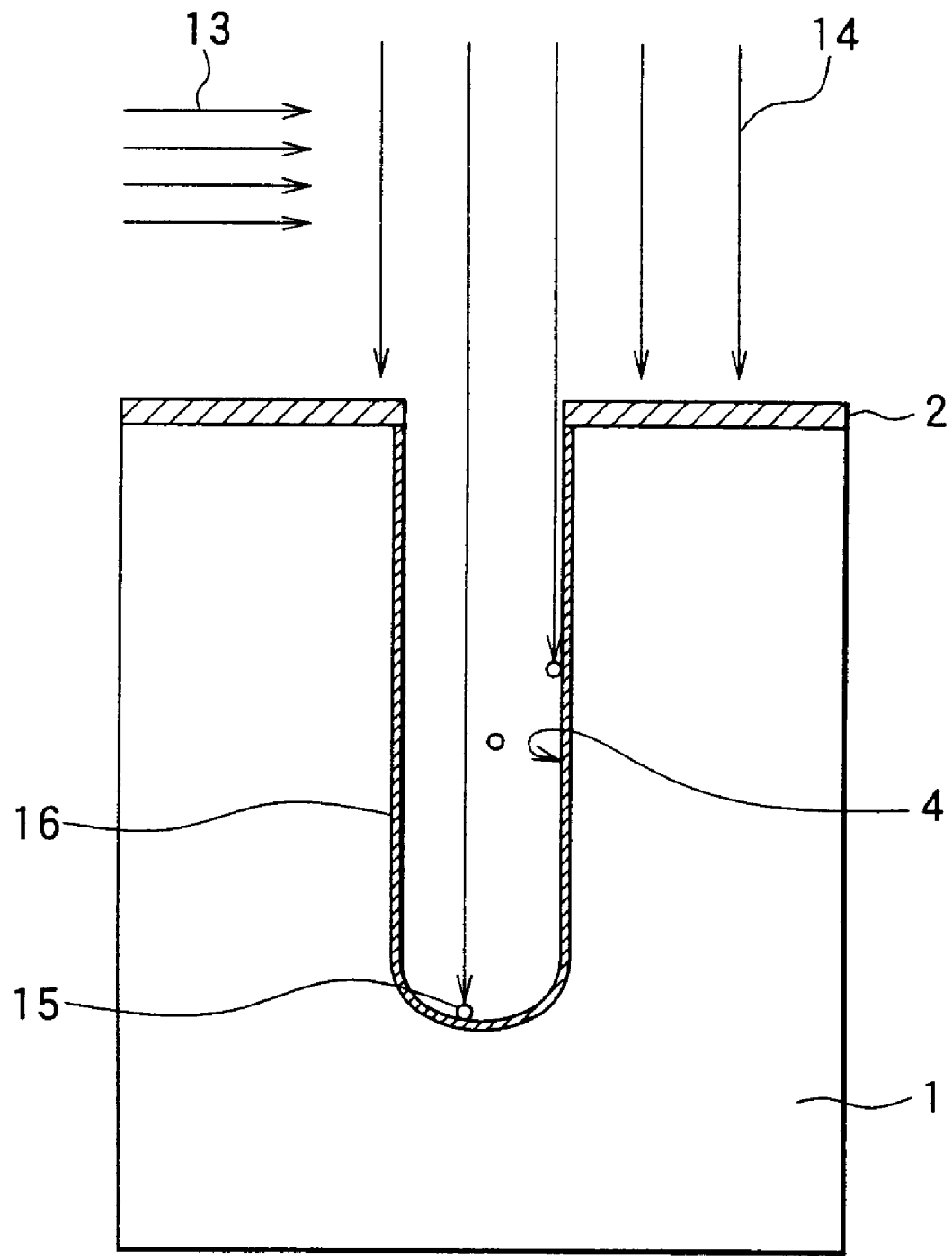
FIG. 4 is sectional view illustrating trench formation according to a second embodiment of the present invention.

A second embodiment of the present invention will be explained hereinafter. In this embodiment, removal of the reaction product (shown in FIG. 1C) using the plasma mixture of Ar gas and $O_2$ gas and formation of the protection oxide film (shown in FIG. 1D) in the first embodiment are replaced with removal of a reaction product and oxidation of the inside surface of the trench using oxygen excited by UV (ultraviolet) rays (FIG. 4). Here, it should be noted that the processes shown in FIGS. 1A, 1B and 1E are substantially the same as those in the first embodiment, and their explanations are omitted.

As shown in FIG. 4, UV rays 14 are radiated to the Si substrate 1 in the chamber 21 shown in FIG. 2 with flowing oxygen gas therein. Oxygen molecule 15 around the inside surface of the trench 4 is excited by the UV rays 14 and becomes ozone ($O_3$) in a radical condition or ion condition. In these conditions, the oxygen molecule 15 is highly chemically activated and is easily oxidized. When the oxygen molecule 15 under this condition collides with the inside surface of the trench 4, the reaction product (e.g., polymer-based film described the above) removed by being dissolved and gasified. An oxide film ($SiO_2$) 16 is formed on the inside surface of the trench 4 due to oxidation of the exposed silicon surface of the trench 4.

An effect of the above-described method of this embodiment will be explained with reference to an experimental result hereinafter.

Figure 5:
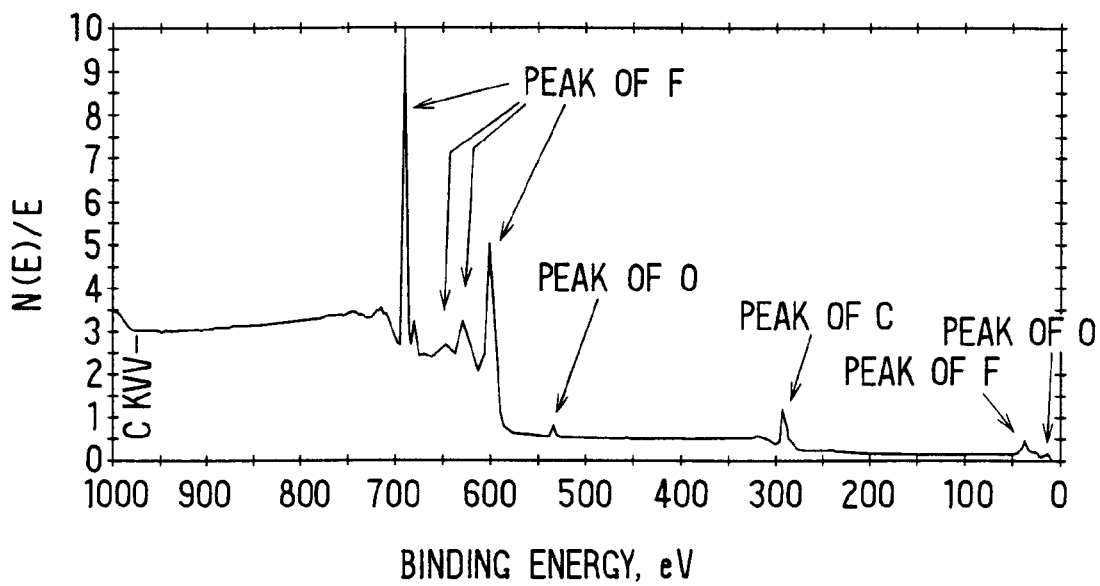
FIGS. 5 and 6 are diagrams illustrating analytical results of a silicon substrate surface based on an XPS (X-ray photoelectron spectroscopy)

FIG. 5 is a diagram illustrating analytical results of a silicon substrate surface based on an XPS (X-ray photoelectron spectroscopy). In this analysis a sample is formed by intentionally depositing a reaction product, such as the polymer-based thin film attached to the inside surface of the trench 4 on the entire surface of the Si substrate. The XPS measures the existing components and combination type. The results show that peaks regarding carbon (C) and fluorine (F) appear with high intensities. It shows that the surface of the Si substrate is covered with a film primarily made of C—F bonding, which is the polymer-based film.

Figure 6:
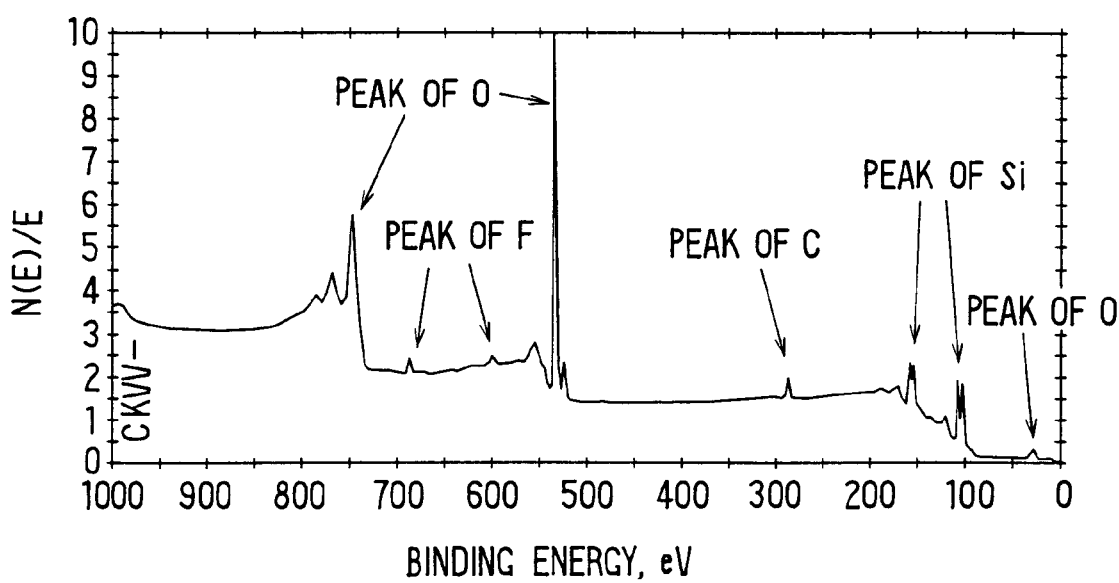

To the contrary, FIG. 6 is also a diagram illustrating analytical results of a silicon substrate surface based on an XPS. In this analysis the surface of the substrate is examined by XPS after radiation of the UV rays 14 to the substrate by the same step as that of FIG. 5. Peaks regarding carbon (C) and fluorine (F) become small, and peak regarding oxygen (O) is appeared with high intensity instead. The peak of silicon (Si) also becomes large. The results show that an oxide film ($SiO_2$) 16 is formed on the surface of the substrate after the polymer film is removed.

As described above, when the UV rays are radiated with flowing oxygen gas a strong oxidation action occurs at the inside surface of the trench so that the reaction product attached to the inside surface of the trench is removed and the oxide film is formed.

Here, in order to perform UV radiation, the oxygen gas 13 may flow through the chamber 21 shown in FIG. 2 by introducing the UV rays 14 from outside the chamber 21 through a window made of silica glass, or directly introducing the UV rays 14 from outside the chamber 21 through a glass fiber.

Furthermore, the UV rays 14 may be introduced in a separate chamber connected to the etching chamber 21. The substrate can be moved from chamber 21 to the separate chamber. Since each of the chambers are connected to each other, this case can be compared to the case where the Si substrate 1 is unloaded from the chamber 21 and is oxidized in a separated oxidation apparatus.

When etching is repeated by interposing protection film formation in this manner an negligible small linear difference (step) portion is generated on the inside surface of the trench 4. The difference portion is generated in the following manner. The trench width is slightly enlarged from the sidewall covered with the protection film when the etching is further advanced from the bottom portion of the trench where there is no protection film. This difference causes the negligible small linear difference portion.

(Third Embodiment)

A third embodiment of the present invention will be explained hereinafter. FIGS. 7A–7I show trench formation for a semiconductor device according to this embodiment.

Figure 7A:
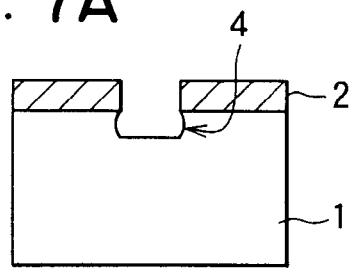
FIGS. 7A–7I are sectional views illustrating trench formation according to a third embodiment according to the present invention.

In FIG. 7A, the oxide film ($SiO_2$) is formed on the silicon (Si) substrate 1. A predetermined region where a trench is to be formed of the oxide film is partly opened to form the oxide film mask 2.

Figure 7B:
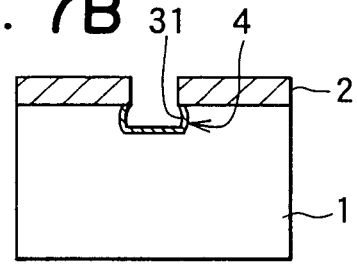
Figure 7C:
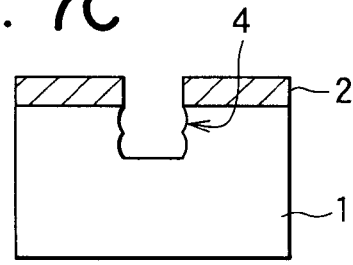
Figure 7D:
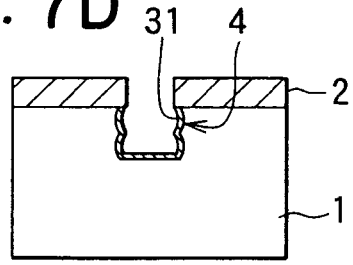
Figure 7E:
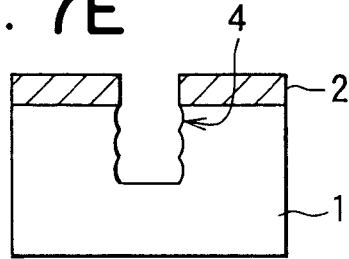

In FIG. 7B, the Si substrate 1 is loaded in the chamber 21 shown in FIG. 2. One of $SF_6$, $Cl_2$, or the like is introduced to the chamber 21 as the etching gas. Plasma is generated in this etching gas by applying an adequate RF electric field such as inductivity-coupled plasma in the chamber 21. Using the plasma results in a trench etching having a high anisotropy performed to the Si substrate 1, which forms the trench 4 in the Si substrate 1. In this etching, the etching time is controlled so that the Si substrate 1 is etched to a predetermined depth.

Next, either $C_4H_8$ gas or a mixture of $CF_4$ and $CHF_3$ gas is introduced to the chamber 21. Plasma is generated in the $C_4H_8$ gas by applying an adequate RF electric field such as inductivity-coupled plasma in the chamber 21. By using the plasma, a polymer film 31 as a first protection film is formed on the inside surface of the trench 4. The process time of the polymer-forming step is controlled so that the thickness of the polymer film 31 is set to a predetermined thickness.

As shown in FIGS. 7A–7E, trench forming shown in FIG. 7A and polymer film forming shown in FIG. 7B are repeatedly performed. Here, the trench etching time and the polymer film forming time are set to the same as those shown in FIGS. 7A and 7B. The trench etching and the polymer film forming define one set that is performed numerous times in this embodiment. As a result, the polymer film on the bottom surface of the trench 4 is removed prior to the sidewall by the anisotropy of the etching during the trench etching and the trench is then gradually deepened as the etching advances. Here, it can prevent the trench 4 from being laterally etched, because the polymer film 3 on the sidewall of the trench 4 performs as a protection film until the polymer film 3 is completely removed. It should be noted that FIGS. 7A–7E correspond to FIG. 1B.

Figure 7F:
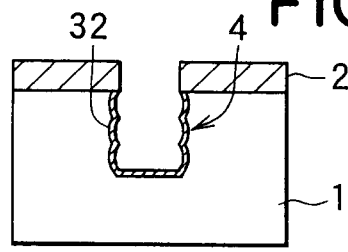

As shown in FIG. 7F, the reaction product attached to the inside surface of the trench 4 is removed by using the same step as shown in FIG. 1C. An oxide film 32 as a second protection film is then formed on the inside surface of the trench 4 by using the same step as shown in FIG. 1D.

Figure 7G:
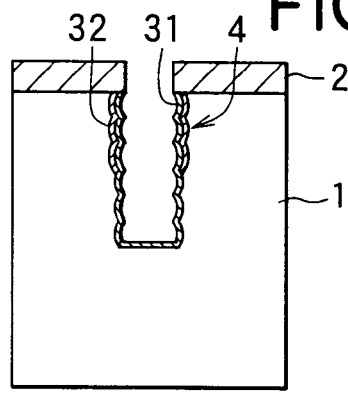

Next, in FIG. 7G, the trench forming and the polymer film forming are repeatedly performed in a similar manner as shown in FIGS. 7A–7E. As the sidewall of the trench 4 is etched while being protected by the polymer film 31, the oxide film 32 on the bottom surface of the trench 4 is removed prior to the sidewall. The etching is then advanced to the depth direction by alternately repeating the reposition and the removal of the polymer film 31 at the bottom surface of the trench 4. The polymer film 31 at the sidewall of the trench is deposited on the oxide film 32 as the second protection film, so that the sidewall of the trench 4 is covered with two layers of protection films. Therefore, even if the polymer film 31 is removed during the trench etching, since there is the oxide film 32 under the polymer film 32, the trench etching can be further advanced while the sidewall of the trench 4 is still protected.

In this trench etching, if only one protection film, which is easily etched by lateral direction etching, is used, the lateral direction etching advances as the trench 4 is deepened so that the trench width is enlarged. If only one protection film having a high durability for lateral direction etching is used, the trench 4 becomes tapered so that the width of the bottom surface of the trench 4 is gradually reduced. Such tapering can possibly stop the etching, as it becomes difficult to advance the etching at the bottom surface of the trench 4.

According to this embodiment, the oxide film 32 having a high durability for the lateral etching is formed only one time per plural trench etchings. Therefore, it can heighten the durability for the lateral etching by covering the sidewall of the trench 4 with two layers of protection films, and further minimize prevention of advance of the etching to the depth direction of the trench by covering the bottom surface of the trench 4 with only the polymer film 31. Therefore, it can prevent the width of the trench 4 from being enlarged, and can prevent the etching from stopping due to tapering of the trench.

Figure 7H:
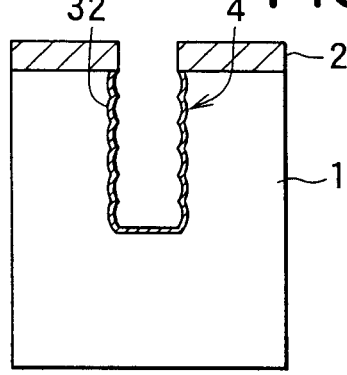

Next, as shown in FIG. 7H, the reaction product attached to the inside surface of the trench 4 is removed as previously shown in FIG. 7F, and the oxide film 32 as the second protection film is formed on the inside surface of the trench 4. In this way, the oxide film as the second protection film is formed per plural repetitions of the trench etching and the polymer film forming.

Figure 7I:
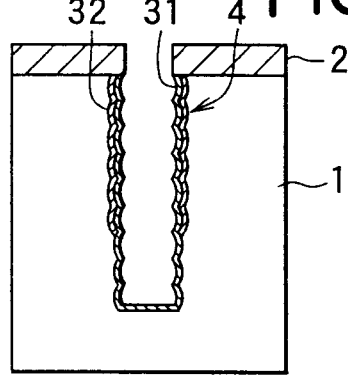

In FIG. 7I, the trench etching and the polymer-forming are repeated. An effect the same as that in FIG. 7G can be obtained, because the sidewall of the trench 4 is covered with the two layers of protection films during this trench etching.

The trench 4 having a desired depth can be formed after the processes shown in FIGS. 7F–7I are repeated performed. As described above, the aspect ratio of the trench 4 can be further increased because the method can protect the width of the trench 4 from being enlarged and can protect the trench from being tapered.

Figure 8:
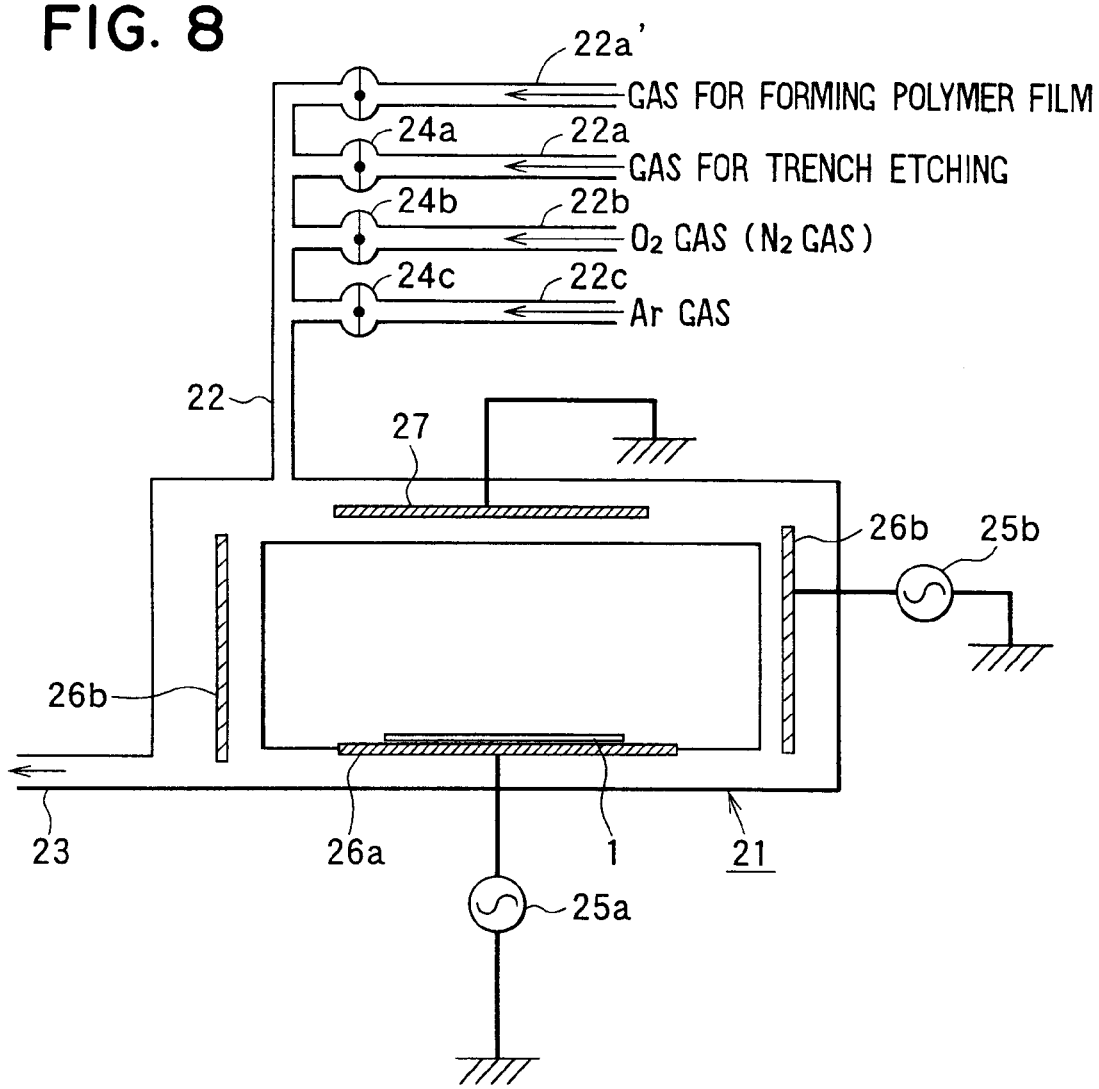
FIG. 8 is a schematic diagram illustrating a chamber in which trench formation of the third embodiment is to be performed.
Figure 9:
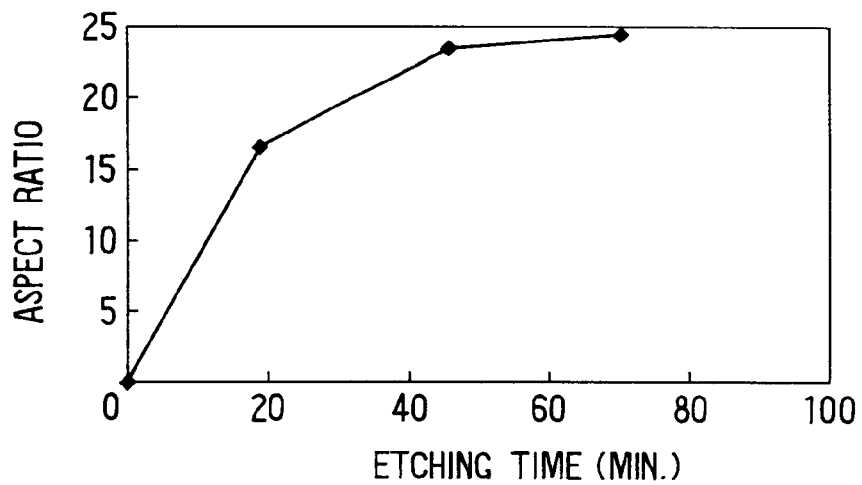
FIG. 9 is a graph illustrating etching time versus aspect ratio when a trench is formed according to prior art.

In the present embodiment, different gases are used in each of the trench etching and the polymer film forming. However, as shown in FIG. 8, a gas line 22a' for forming the polymer film may be further provided to the chamber 21 in addition to the gas line 22a for the trench etching so that these gas lines 22, 22' may be switched.

(Modifications)

In the above-described embodiments, the reaction product of the inside surface of the trench 4 is removed as shown in FIG. 1C. This may be omitted by adequately modifying a plasma generating condition as shown in FIG. 1D.

In the first embodiment, the oxide film 11 is formed as the protection film for the sidewall of the trench 4. However, a nitride film ($SiN_x$) may also be formed as the protection film. This modification achieves the same result as that of the first embodiment. In the third embodiment, the oxide film is used as the second protection film. A nitride film may be also used as the second protection film. In this case, the nitride film as the (second) protection film can be formed by using gas including nitrogen ($N_2$) in the processes shown in FIGS. 1C and 1D, or FIGS. 1F and 1H, and by processing the Si substrate in nitrogen plasma atmosphere. Particularly, in the case where a resist mask is used instead of the oxide film mask 2 in each of the embodiments, the resist mask may be completely eliminated during oxide film formation. Therefore, this modification is preferable when the resist mask is used as the mask, because the resist mask will not be eliminated in the nitrogen plasma. In this case, removal of the reaction product of the inside surface of the trench 4 may be omitted by adequately modifying a plasma generating condition at the process shown in FIG. 1D, or in FIGS. 7F and 7G. In other words, the oxide film (or nitride film) can be formed with removing the reaction product by only the oxygen plasma (or nitrogen plasma).

FIG. 7F of the third embodiment shows how the reaction product on the inside surface of the trench may be removed, or how the inside surface of the trench 4 may be oxidized, by introducing oxygen gas excited by the UV rays and by generating plasma of the excited oxygen gas in the chamber 21.

The oxide film as the second protection film is formed through plural formation repetitions, each of which includes the trench etching process and polymer film formation. The number of repetitions performed between every second protection film formation is determined so that the formation ends before the oxide film (or nitride film) that is acting as the second protection film is removed from the sidewall of the trench 4. By using this modification, the sidewall of the trench is always protected from the etching by the always-existing oxide film (or nitride film).

Conditions of generating the plasma during trench etching and polymer film formation may be appropriately modified as the trench 4 is deepened. In general, when a plasma condition is fixed during trench etching and polymer film formation, the trench is gradually changed to a tapered shape. This occurs because the amount of etchant arriving to the bottom surface of the trench decreases. Therefore, it can efficiently prevent the etching from decreasing and the trench from being tapered by changing the plasma condition. For example, an acceleration voltage of ion toward the substrate may increase as the trench is deepened during trench etching. A similar modification may be applied to a condition of generating the oxygen plasma (or nitrogen plasma) during the formation of the second protection film and to a process time thereof. Generally, the deeper the trench becomes, the easier the sidewall of the trench 4 is etched due to slantingly incoming ions or the like. Therefore, it can completely protect the sidewall of the trench by modifying the oxygen plasma (or nitrogen plasma) condition. For example, the plasma generating condition may be changed as the trench is deepened, or the process time may be prolonged as the trench is deepened, so as to facilitate formation of the oxide film.

What is claimed is:

1. A method of manufacturing a semiconductor device comprising:
   a plurality of first steps, each of the first step including:
      a trench forming step for forming a trench in the semiconductor substrate by using a reactive ion etching; and
      a first protection film forming step for forming a polymer film as a first protection film on an inside surface of the trench; and
   a second step including a second protection film forming step for forming a second protection film having high durability for etching compared to the polymer film on the inside surface of the trench, the second protection film forming step is performed every plural first steps, wherein
   a set of the plural first steps and the second step is repeatedly performed to form a final trench.

2. A method of manufacturing a semiconductor device according to claim 1, wherein:
   each of the plural first steps and the second step is performed in a common chamber, and is performed by changing type of gas to be introduced to the chamber depending on the these steps.

3. A method of manufacturing a semiconductor device according to claim 1, wherein the gas introduced to the chamber at the trench forming step is gas including one of $SF_6$ gas and $Cl_2$ gas.

4. A method of manufacturing a semiconductor device according to claim 1, wherein the gas introduced to the chamber at the polymer film forming step is gas including one of $C_4H_8$ gas and mixture gas of $CF_4$ and $CHF_3$.

5. A method of manufacturing a semiconductor device according to claim 1, wherein:
   the gas introduced to the chamber at the second protection film forming step is gas including oxygen gas; and
   the second protection film formed in the second protection film forming step is made of an oxide film.

6. A method of manufacturing a semiconductor device according to claim 1, wherein:
   the gas introduced to the chamber at the second protection film forming step is gas including oxygen gas;
   the second protection film forming step is performed in oxygen gas atmosphere in which UV rays are radiated to oxygen gas; and
   the second protection film formed in the second protection film forming step is made of an oxide film.

7. A method of manufacturing a semiconductor device according to claim 1, wherein:
   the gas introduced to the chamber at the second protection film forming step is gas including nitrogen gas; and
   the second protection film formed in the second protection film forming step is made of a nitride film.

8. A method of manufacturing a semiconductor device according to claim 1, wherein a total process time of the plural first steps performed between every the second step is determined shorter than a time during which the second protection film is completely removed from the sidewall of the trench.

9. A method of manufacturing a semiconductor device according to claim 1, wherein:
   each of the trench etching step and the polymer film forming step is performed under plasma of gas introduced to the chamber, and is performed by individually determining a plasma generation condition depending on a depth of the trench.

10. A method of manufacturing a semiconductor device according to claim 1, wherein:
   the second protection film forming step is performed under plasma of gas introduced to the chamber, and is performed by individually determining a plasma generation condition and a process time depending on a depth of the trench.

* * * * *